(12) United States Patent
Dusija et al.

(10) Patent No.: US 10,373,696 B2
(45) Date of Patent: Aug. 6, 2019

(54) METHODS AND OPERATIONS USING XNOR FUNCTIONS WITH FLASH DEVICES AND SOLID STATE DRIVES

(71) Applicant: Western Digital Technologies, Inc., San Jose, CA (US)

(72) Inventors: Gautam Ashok Dusija, Burlingame, CA (US); Aaron Lee, Sunnyvale, CA (US); Mrinal Kochar, San Jose, CA (US); Deepak Raghu, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/104,696

(22) Filed: Aug. 17, 2018

(65) Prior Publication Data
US 2019/0057750 A1    Feb. 21, 2019

Related U.S. Application Data

(60) Provisional application No. 62/497,314, filed on Aug. 18, 2017.

(51) Int. Cl.
*G11C 16/34*    (2006.01)
*G06F 11/08*    (2006.01)
*G11C 11/56*    (2006.01)
*G11C 16/26*    (2006.01)

(52) U.S. Cl.
CPC .......... *G11C 16/3436* (2013.01); *G06F 11/08* (2013.01); *G11C 11/5642* (2013.01); *G11C 16/26* (2013.01)

(58) Field of Classification Search
CPC ........................ G11C 11/6628; G11C 16/3436
USPC ....................................................... 365/200
See application file for complete search history.

(56) References Cited

U.S. PATENT DOCUMENTS

2004/0109362 A1*    6/2004    Gongwer ............ G11C 11/5628
                                                                    365/200

\* cited by examiner

*Primary Examiner* — Jason Lappas
(74) *Attorney, Agent, or Firm* — Vierra Magen Marcus LLP

(57) ABSTRACT

A method for writing data to a NAND flash memory is disclosed, having steps of writing a first set of data to a first memory block, writing a second set of data to a second memory block, writing a third set of data to a third memory block and writing a fourth set of data to a XNOR memory block.

14 Claims, 5 Drawing Sheets

METHODS AND OPERATIONS USING XNOR FUNCTIONS WITH FLASH DEVICES AND SOLID STATE DRIVES

CROSS-REFERENCE TO RELATED APPLICATIONS

The current application claims priority to U.S. Provisional Application 62/497,314 filed Aug. 18, 2017, the entirety of which is incorporated by reference.

FIELD OF THE DISCLOSURE

Aspects of the disclosure relate to storage of data. More specifically, aspects of the disclosure involve methods and apparatus for storing data onto NAND flash memory using XNOR operations.

BACKGROUND

Field

The storage of data is a primary function of modern computing. As time progresses and technology increases, data storage becomes an increasingly vital function for users. Corporate or enterprise users demand even more performance from data storage systems. Data storage devices are furthermore called upon to perform required functions in a cost efficient manner. Elimination or minimization of expensive components is desired and as such certain parts add significantly to the overall cost of the storage device. One specific component of the typical storage device system that can be costly to design is the system controller. The system controller handles operations related to data handling. The memory section of the storage device may be a magnetic based hard disk or a NAND flash unit.

NAND flash units, in particular, are increasingly being manufactured such that the design of such drives can incorporate advanced technologies more quickly. Additionally, NAND flash units are becoming more efficient at storing and retrieving data from compact spaces and are thus ideal for certain types of computing applications. NAND flash units, for example, because of the lack of moving parts, are well suited to providing memory operations for small or portable computers. The lack of moving parts also helps users maintain data as errors on these types of storage devices are less likely to occur than on more mechanically complicated devices.

There is a need to provide a storage device, such as a solid state drive (SSD) that is economical.

There is a further need to provide a SSD that is more economical than conventional SSD devices.

There is a still further need to provide a SSD that is more economical to operate in aspects related to system hardware and overall storage operations compared to conventional systems.

SUMMARY

In one non-limiting embodiment, a method for writing data to a NAND flash memory is disclosed having steps of writing a first set of data to a first memory block, writing a second set of data to a second memory block, writing a third set of data to a third memory block and writing a fourth set of data to a XNOR memory block.

In another non-limiting embodiment, a method for writing data to a NAND flash memory is disclosed providing for writing a first set of data to a first memory block, writing a second set of data to a second memory block and writing a third set of data to a third memory block. The method further provides for writing a fourth set of data to a XNOR memory block and checking the first memory block, the second memory block and the third memory block with the XNOR memory block. The method also provides for correcting at least one of the first memory block, the second memory block and the third memory block when the checking indicates an error in the first memory block, the second memory block and the third memory block, writing a fifth set of data to the first memory block, writing a sixth set of data to a second memory block, writing a seventh set of data to a third memory block and writing a eighth set of data to a XNOR memory block.

In another non-limiting embodiment, a device is disclosed having a NAND flash memory, means for creating a first memory block configured to accept a first set of data for the NAND flash memory, means for creating a second memory block configured to accept a second set of data for the NAND flash memory, means for creating a third memory block configured to accept a third set of data for the NAND flash memory, means for creating a XNOR memory block configured to accept a fourth set of data for the NAND flash memory and means for comparing the fourth set of data to the first set of data, the second set of data and the third set of data.

In another non-limiting embodiment, a method for storing data on a flash device is disclosed comprising creating at least two blocks of data on the flash drive; creating at least one block related to XNOR operations on the flash drive; receiving a command for writing at least two sets of data to the at least two blocks of data, writing at least a first set of data to at least one created block; writing at least a second set of data to a second of the created block, writing at least a third set of data to the at least one block for XNOR operations, wherein the third set of data contains the first set of data and the second set of data, checking for errors in writing of the data in the one created block and the second of the created blocks by comparing the data in one block for XNOR operations and the first set of data in the created block and the second set of data in the second created block.

Other aspects and advantages will become apparent from the following description and the attached claims.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Some embodiments will now be described with reference to the figures. Like elements in the various figures will be referenced with like numbers for consistency. In the following description, numerous details are set forth to provide an understanding of various embodiments and/or features. It will be understood, however, by those skilled in the art that some embodiments may be practiced without many of these details and that numerous variations or modifications from the described embodiments are possible. As used herein, the terms "above" and "below", "up" and "down", "upper" and "lower", "upwardly" and "downwardly", and other like terms indicating relative positions above or below a given point or element are used in this description to more clearly describe certain embodiments.

Figure 1:
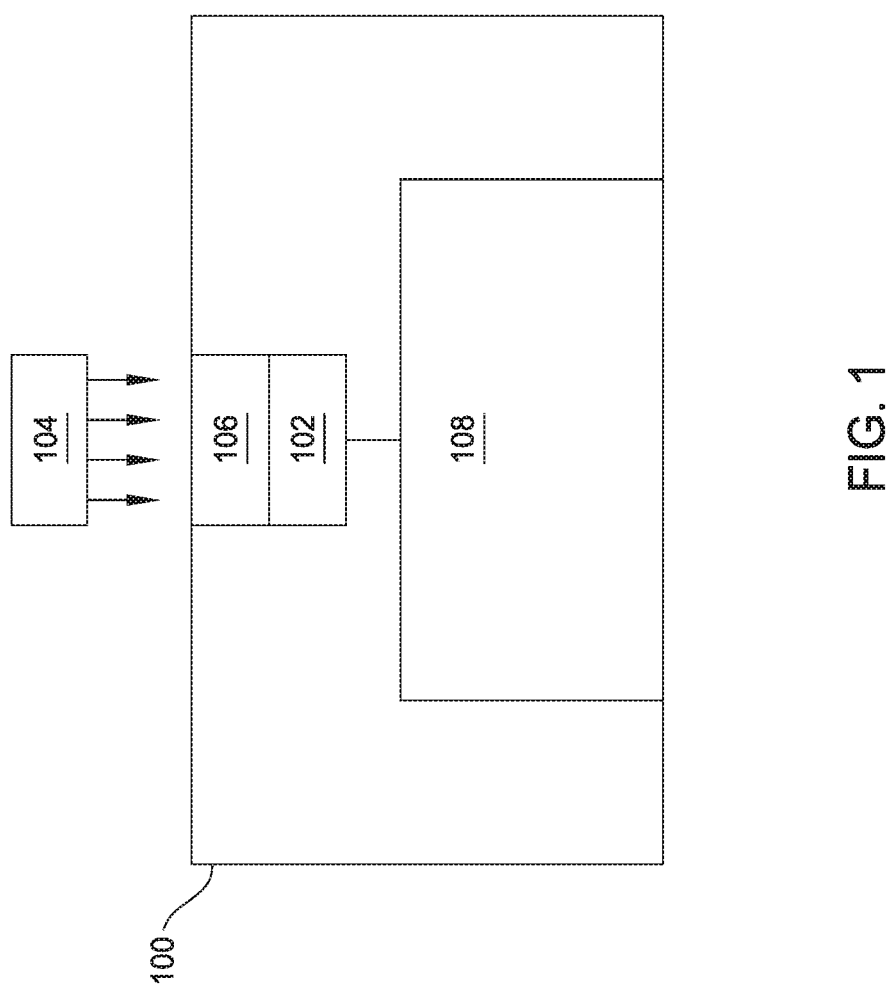
FIG. 1 is a schematic representation of a solid state drive that uses a method of storing data in conformance with one example embodiment.

Referring to FIG. 1, a schematic representation of a solid state drive 100 is illustrated. The solid state drive 100 is a unit that may be used in a computer or a server. The solid state drive 100 utilizes a memory to store information such that the information may be retrieved at the desire of a user. In the instant case, the solid state drive 100 uses a flash memory, such as a NAND flash memory 108. Although described as a NAND flash memory, other types of memory other than NAND flash may be used and the description of a NAND flash memory should not be considered limiting.

A controller 102 is provided in the solid state drive 100 to perform functional operations that are needed by a host 104. The host 104 sends information, such as a request to store data, to the controller 102 such that the instructions are received and processed by the controller 102. The controller 102 may be configured with an interface 106 to allow the controller 102 the ability to communicate with the host 104. The communication protocol between the controller 102 and the host 104 may be any typical communication protocol, such as TCP/IP, IPX/SPX or AppleTalk. Dual or multiple communication protocols are also within contemplation of the present disclosure.

The controller 102 may be a complicated design or a simple design when incorporated into the solid state drive 100. In an attempt to decrease the complexity of the controller 102, aspects presented herein attempt to minimize certain aspects or functions of the controller 102. By limiting the functions performed by the controller 102, the corresponding economic cost of the controller 102 is reduced, the controller 102 is more cost effective to manufacture and potential errors by the controller 102 are minimized.

A typical function of the controller 102 is to provide instructions and/or communication on the acceptance and routing of data to the NAND flash 108. The controller 102 in the illustrated embodiment is a "on chip" controller 102 where the control mechanism is placed on a computer chip that has been created for the purpose of providing instructions to other sections of the solid state drive 100 and providing for interface with the host 104.

Aspects described herein accomplish the writing, reading and error checking responsibilities by using data latches and the NAND flash 108. For definition, a latch is defined, in one non-limiting embodiment, as a circuit that has two stable states and that is used to store information. The latch may be switched or flip-flopped, from one of the stable states to another through actuation. Such actuation will allow a different function to be performed or depending upon the configuration, a set of data ("0" or "1") to be stored.

The method of using an XNOR function for performing these functions allows for a simple yet robust method for storing data. XNOR functions may be used with the NAND flash, as presented herein, to replace system XOR functions. In the illustrated embodiment, these XNOR functions are not used on control blocks since write functions on these blocks is fairly uncommon. Furthermore, writing to control blocks may not be a full die page size. Moreover, the method described herein uses writing and reading techniques for "blocks", which may be a grouping of memory units that may not be provided for control blocks.

In the illustrated embodiments, XNOR blocks of data may be used to perform verification/checking of data written to other blocks. Once verification/checking of other data blocks has been completed and the blocks that were checked are satisfactory, the XNOR blocks of data may be erased. XNOR block functions that are subsequent to the erasure of the XNOR block may begin anew. As a result of the XNOR function block starting new, efficiency of the entire system is increased and use of NAND flash for XNOR functions is minimized compared to conventional systems that write data to NAND flash block areas and take multiple snap shots of data and perform post writing and reading error analysis. In alternative embodiments, the XNOR block may be erased at any later time after a successful checking or may not be erased at all. With sufficient block size, the XNOR block can provide an essentially second copy of the data contained in block 1, block 2 and block 3. As the XNOR block could provide such a copy of the blocks 1, 2 and 3, the XNOR block could be downloaded to a separate memory for data security and safety purposes.

In the illustrated embodiment, the functions using XNOR can be used in single level cell (SLC) type memory to improve performance of the system. Although described as applicable to SLC, the methods and apparatus described are applicable to multi-level cell (MLC), three level cell (TLC) or quad level cell (QLC) technologies as non-limiting embodiments. Example embodiments presented provide an example related to a three level cell (TLC) where memory operations are detailed regarding the attached figures.

Figure 2:
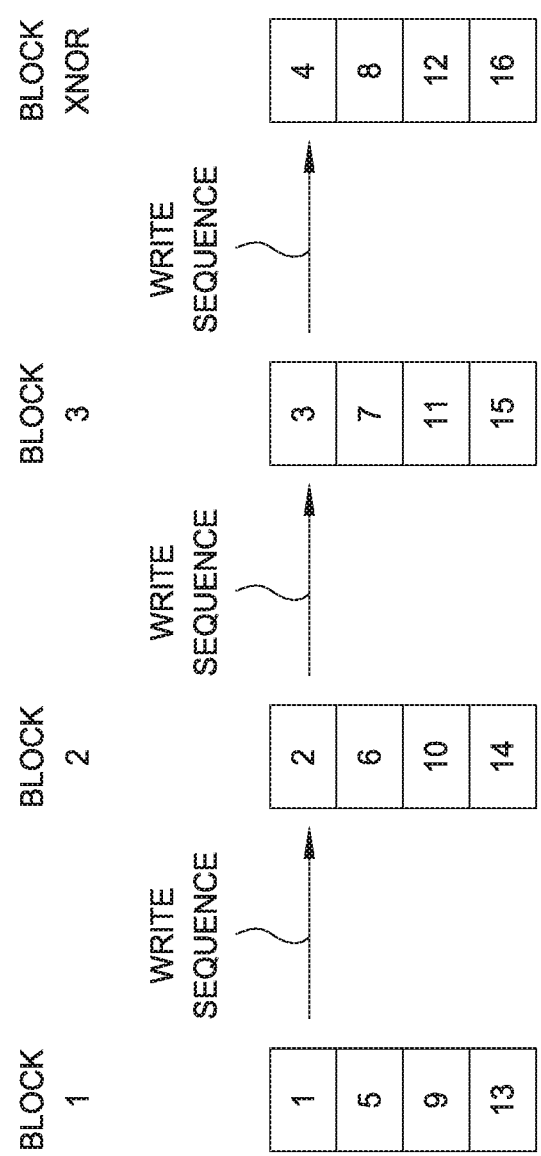
FIG. 2 is a diagram of blocks being written upon using an XNOR block for data storage purposes.

FIG. 2 is an example of the use of the XNOR function along with NAND flash memory, wherein data that needs to be written to the NAND flash will be grouped into three (3) blocks (1, 2, 3). In addition to writing data to blocks (1, 2, 3), data will also be written to a further (XNOR) block. The purpose of the XNOR block is to allow the system to verify data placed in preceding blocks, such as block 1, block 2 and block 3. By use of illustration and description, it is desired to write the numbers 892, 4141 and 316 into NAND flash memory 108 for retrieval at another time. In FIG. 2, progression of the write sequence of data onto the NAND flash 108 proceeds from left to right. Block 1 is constructed from individual blocks 1, 5, 9 and 13. In a like fashion, block 2 contains blocks 2, 6, 10 and 14. Block 3 contains blocks 3, 7, 11 and 15. Block XNOR block contains blocks 4, 8, 12 and 16.

The write sequence of data starts from the left and the number 892 is placed in block 1. The next piece of data to be written will enter block 2 as the process proceeds to the right. The data number 4141 is placed in block 2. The method then proceeds as per the above and number 316 is written to block 3.

The process then proceeds to block XNOR (block 4) where data 892, 4141 and 316 are entered. A check of the data placed in blocks 1, 2 and 3 may then occur. Either the XNOR block or the separate error checking function may be used to determine the presence of errors. In the illustrated embodiment, block 4 from block XNOR is cross referenced to the data placed in block 1, block 1 (892), block 2, block 2 (4141) and block 3, block 3 (316).

If the comparison that is performed indicates that the values in the aforementioned blocks match the values provided in the XNOR block 4, then the process can begin anew at block 5 of block 1 with new data that may be sent to the controller 102 from the host 104. At any time, after the comparison check/cross reference check is successfully passed above (described above), the values in the XNOR block may be erased. To that end, the XNOR block may have data placed in only block 4 or, in another alternative, data in block 4 and 8, or any other combination of filled blocks in the XNOR block. As an additional feature, if compression is needed across planes, chip compression may be used before writing XNOR data to the end of the block. If a different error checking procedure/cross reference procedure is used, such as an enhanced post read write (EPRW) operations, then the XNOR block may simply be erased or not used. If a power failure occurs during the writing process and a recovery of data is needed, conventional methods for recovering from such interruptions may be used. As will be evident, 1 temporary XNOR block is used in the process. For TLC writes, 3 SLC blocks or 1 TLC block is used. For QLC writes, 4 SLC blocks or 1 QLC block is used. For 3D NAND technology, extra latches can be added to hold XNOR data for open blocks on that die. In another example embodiment, the data from the XNOR block can be exported to an X4 memory (QLC) or other type of memory as a backup.

Figure 3A:
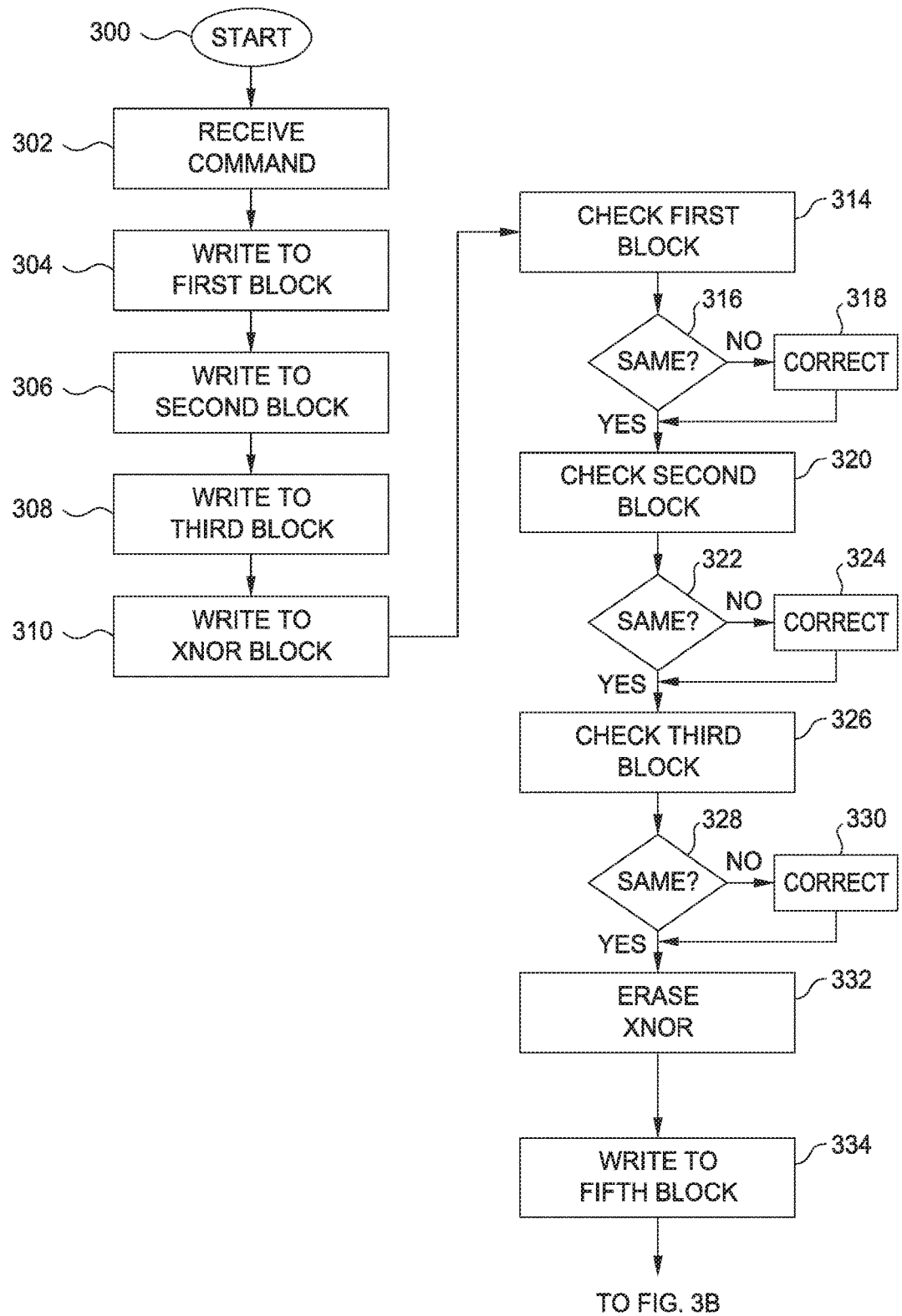
FIGS. 3A and 3B are a flow chart for processing data in conformance with an example embodiment of the disclosure.
Figure 3B:
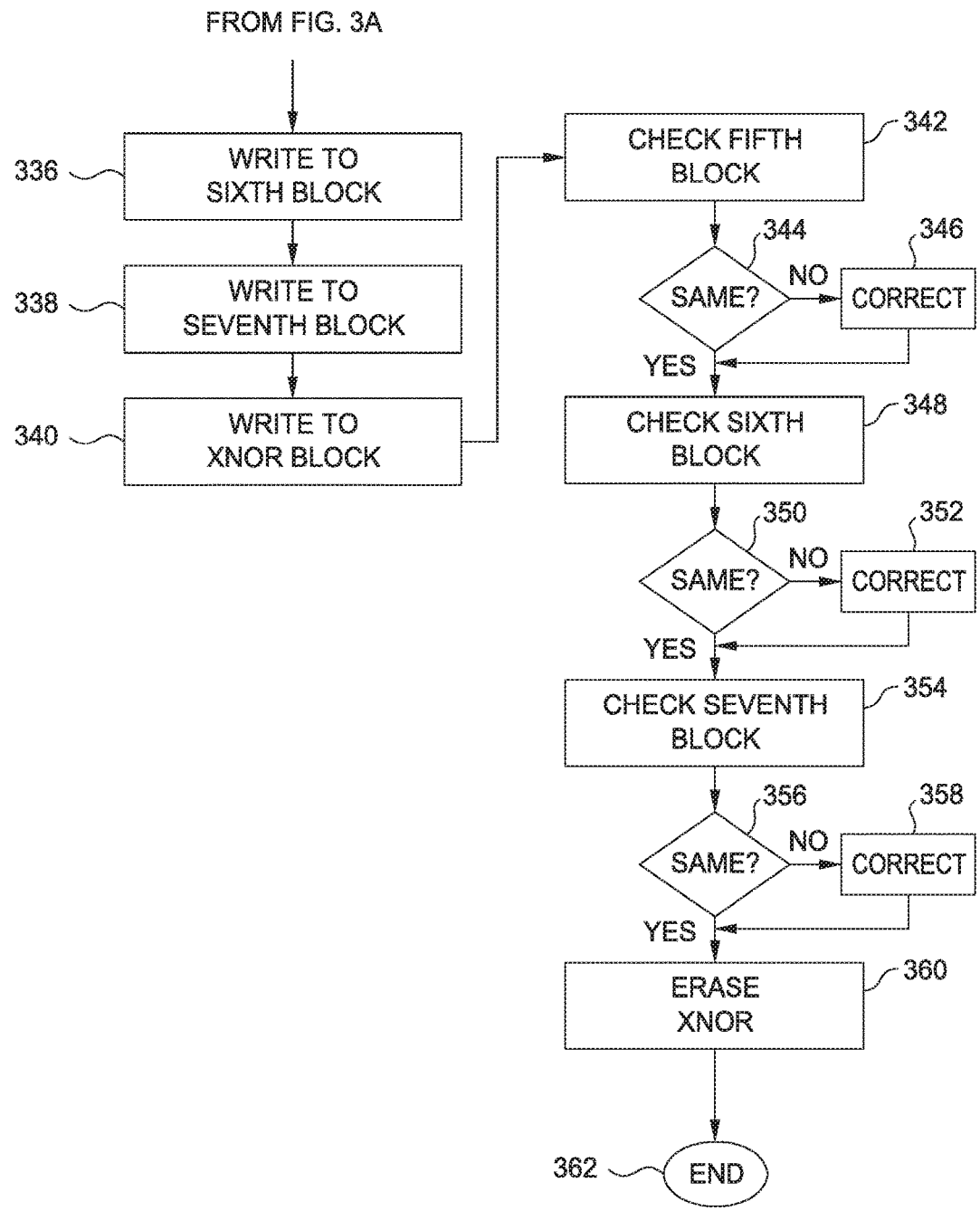

Referring to FIGS. 3A and 3B, a method for using an XNOR function for writing to solid state drive, such as NAND flash 108 is illustrated. The method starts at 300. A command is received at 302, for example, at the controller 102 to perform write operations to a NAND flash 108 for a solid state drive. A first set of data is written to a first memory block at 304. A second set of data is written to second memory block at 306. A third set of data is written to a third block at 308. The data from the first set of data, the second set of data and the third set of data is written at an XNOR block at 310.

A check of the first block to the data in the XNOR block occurs at 314. A query is run at 316 to determine if the data in the first block is equal to the XNOR block portion that pertains to the first block. If the data is not the same, then a correction occurs at 318 and the method progresses to 320. If the data is the same at the query at 316, the method proceeds to 320.

A check of data for the second block occurs at 320. The method proceeds to 322 where a query is performed to determine if the data in the second block is equal to the data in the XNOR block pertaining to the second block. If the data is not equal, then a correction is performed at 324 to the data in block 2 with the data from XNOR pertaining to block 2. The method then proceeds to 326. If the data is equal at 322, then the method proceeds to 326.

A check of data for the third block occurs at 326. The method proceeds to 328 where a query is performed to determine if the data in the third block is equal to the data in the XNOR block pertaining to the third block. If the data is not equal, then a correction is performed at 330 to the data in block 3 with the data from XNOR pertaining to block 3.

The method then proceeds to 332. If the data is equal at 328, then the method proceeds to 332.

At 332, the XNOR block may be erased as the data present in the first block, second block and third block have been verified to be correct. The method then proceeds to 334 where data is written to the fifth block. From 334, the method proceeds to 336 where data is written to the sixth block and then to 338 where data is written to the seventh block. Data is then written to the XNOR block at 340.

Similar to the method described above, a series of checks and corrections are made if data is found to be incorrect in the fifth, sixth and seventh blocks. At 342, the fifth block is checked to the values in XNOR to see if the values are equal. If, at the query at 344, the values are equal, then the method proceeds to 348. If the values are not equal, then a correction may be made to the fifth block at 346 with the method proceeding to 348.

At 348, the sixth block is checked to the values in XNOR to see if the values are equal. If, at the query at 350, the values are equal, then the method proceeds to 354. If the values are not equal, then a correction may be made to the sixth block at 352 with the method proceeding to 354.

At 356, the seventh block is checked to the values in XNOR to see if the values are equal. If, at the query at 356, the values are equal, then the method proceeds to 360. If the values are not equal, then a correction may be made to the seventh block at 358 with the method proceeding to 360.

At 360, the XNOR block may be erased as the data present in the fifth block, sixth block and seventh block have been verified to be correct. The method may then end at 362.

Although shown as ending at 362, the method may continually repeat as necessary. Erasure of the XNOR block at 332 and 360 may be performed after each successful check. Compression of data may happen at any step of the process as necessary. Data may also be returned to the host 104 such that notification is made that operations are complete. Such notification can be by visual representation on a monitor, print out, or other appropriate notification system. Although not shown in the method, the forming of the blocks may also be incorporated at the start of the method, wherein a user may select the size, as a non-limiting example, of the block. As provided previously, the method described is applicable to non-control block data written to a NAND flash.

Figure 4:
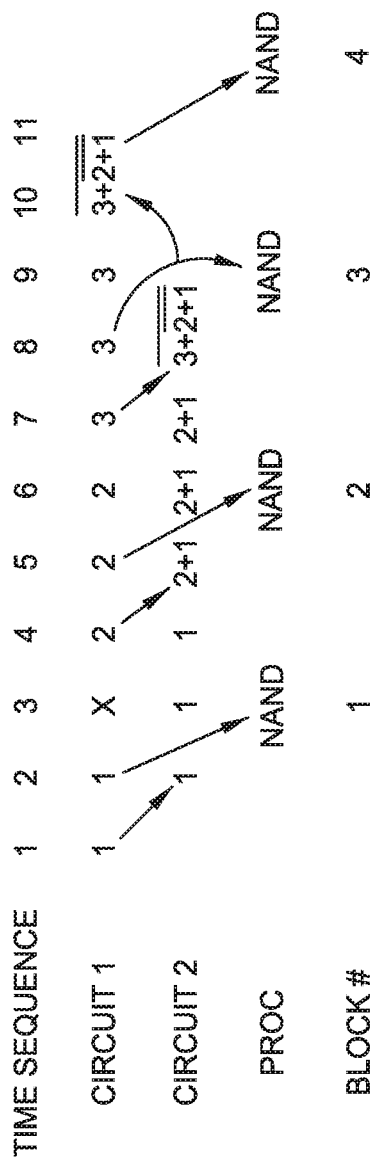
FIG. 4 is a time slice/command operation flow chart diagramming data locations and transactions.

Referring to FIG. 4, a time slice/command operation flow chart diagramming data locations and transactions is provided. At the top of the chart individual time sequence (slices) are provided. In the data provided, time slice 2 occurs after time slice 1. The time elapsed between time slice 1 and time slice 2 need not be equal. The time slices, therefore, merely show a logical progression of actions/activities as time progresses.

In time slice 1, data is present in circuit 1. No data is present in circuit and no program functions are being performed. Time slice 2 shows that data is copied from circuit 1 to circuit 2 and the original data is maintained in circuit 1. Between time slice 2 and time slice 3, data is written from circuit 1 to the NAND flash 108 as shown in the program functions.

Progressing to time slice 4, a new set of data is received in circuit 1 and the data from circuit 2 in time slice 3 is maintained in time slice 4. Progressing to time slice 5, data from circuit 1 in time slice 4 is maintained unchanged in time slice 5. Circuit 2, however, is changed where data written in Circuit 2 is data set 2 and data set 1. Progressing to time slice 6, data from circuit 1 is written to NAND flash 108. Data in circuit 1 is maintained from time slice 5 to 6.

Data in circuit 2 is maintained unchanged between time slice 5 and time slice 6. Progressing to time slice 7, a new set of data 3 is accepted into circuit 1. Data is maintained in circuit 2 between time slice 6 and 7 unchanged.

Progressing to time slice 8, data in circuit 1 is maintained unchanged from time slice 7 to time slice 8. The values in circuit 2 are changed, wherein the value in circuit 2 is augmented to data set 3, data set 2 and data set 1. Between time slice 8 and time slice 9, data from circuit 1 is written to NAND flash 108. In time slice 9, data set 3 is maintained in circuit 1. Data is maintained in circuit 2 which equals data set 3, data set 2 and data set 1.

Progressing to time frame 10, data is copied from data circuit 2 to circuit 1. From time slice 10 to time slice 11, data is copied from circuit 1 to NAND flash 108. According to the sequence described above in relation to the time slice operations, the operations can be repeated from time slice 9 onward without stopping at time slice 10. As will be understood, circuits 1 and 2 may be latches. Furthermore, for aspects related to QLC types of data storage, it will be understood that four (4) blocks of data may be written before a check is performed at an XNOR block.

In one non-limiting embodiment, a method for writing data to a NAND flash 108 memory, comprising writing a first set of data to a first memory block, writing a second set of data to a second memory block, writing a third set of data to a third memory block, and writing a fourth set of data to a XNOR memory block.

In another non-limiting embodiment, the method may be performed wherein the fourth set of data contains the data of the first set of data, the second set of data and the third set of data.

In another non-limiting embodiment, the method may further comprise checking for errors in the writing of the first set of data, the writing of the second set of data and the third set of data through comparison of the first set of data, the second set of data and the third set of data with the fourth set of data in the XNOR memory block.

In a still further non-limiting embodiment, the method may further comprise checking for errors in the writing of the first set of data, the writing of the second set of data and the third set of data through an enhanced post write and read operation.

In another non-limiting embodiment, the method may be performed wherein the block contains at least two data blocks.

In another non-limiting embodiment, the method may be performed wherein the block contains at least four data blocks.

In another non-limiting embodiment, the method may be performed wherein the data in the first set of data, the second set of data and the third set of data is compressed.

In another non-limiting embodiment, the method may further comprise compressing the data in the first set of data, the second set of data and the third set of data by an off chip compression method prior to the writing of the data.

In another non-limiting embodiment the method may be performed wherein the writing of the data to the first block, the second block and the third block is through use of a latch.

In another non-limiting embodiment, the method may be performed wherein the latch is a NAND latch.

In another non-limiting embodiment, the method may be performed wherein the writing to the memory block is a single level cell memory type.

In another non-limiting embodiment, the method may further comprise erasing the XNOR memory block.

In another non-limiting embodiment, the method may further comprise erasing the XNOR memory block.

In another non-limiting embodiment, a method for writing data to a NAND flash memory is disclosed comprising writing a first set of data to a first memory block, writing a second set of data to a second memory block, writing a third set of data to a third memory block and writing a fourth set of data to a XNOR memory block. The embodiment may also provide for checking the first memory block, the second memory block and the third memory block with the XNOR memory block, correcting at least one of the first memory block, the second memory block and the third memory block when the checking indicates an error in the first memory block, the second memory block and the third memory block, writing a fifth set of data to the first memory block, writing a sixth set of data to a second memory block, writing a seventh set of data to a third memory block and writing a eighth set of data to a XNOR memory block.

In another non-limiting embodiment, the methods may further comprise checking the first memory block, the second memory block and the third memory block with the XNOR memory block and correcting at least one of the first memory block, the second memory block and the third memory block when the checking indicates an error in the first memory block, the second memory block and the third memory block.

In another non-limiting embodiment, the methods may further comprise erasing the XNOR memory block after the correcting the at least one of the first memory block, the second memory block and the third memory block when the checking indicates an error in the first memory block, the second memory block and the third memory block.

In another non-limiting embodiment, the methods may further comprise compressing the data in the first set of data, the second set of data and the third set of data by an off chip compression method prior to the writing of the data.

In another non-limiting embodiment, the methods may further comprise exporting data from the XNOR block to a QLC memory.

In another non-limiting embodiment the methods may further comprise erasing the data in the XNOR block.

In another non-limiting embodiment a device comprises a NAND flash memory and means for creating a first memory block configured to accept a first set of data for the NAND flash memory, means for creating a second memory block configured to accept a second set of data for the NAND flash memory, means for creating a third memory block configured to accept a third set of data for the NAND flash memory, means for creating a XNOR memory block configured to accept a fourth set of data for the NAND flash memory and means for comparing the fourth set of data to the first set of data, the second set of data and the third set of data.

In another non-limiting embodiment, a method for storing data on a flash device, is presented having steps of creating at least two blocks of data on the flash drive, creating at least one block related to XNOR operations on the flash drive, receiving a command for writing at least two sets of data to the at least two blocks of data, writing at least a first set of data to at least one created block, writing at least a second set of data to a second of the created block, writing at least a third set of data to the at least one block for XNOR operations, wherein the third set of data contains the first set of data and the second set of data, checking for errors in writing of the data in the one created block and the second of the created blocks by comparing the data in one block for XNOR operations and the first set of data in the created block and the second set of data in the second created block.

In another example embodiment, the method may further comprise erasing the at least one block for XNOR operations after the checking for errors.

In another example embodiment, the method may further comprise copying data from the at least one block for XNOR operations to another memory.

In another non-limiting embodiment, the method may be performed wherein the checking for errors is provided by an enhanced post write read operation.

In another non-limiting embodiment, the method further comprise compressing data with an off chip compression method prior to the writing of data.

In another non-limiting embodiment, the method may be performed wherein each block is composed of at least three memory blocks.

In another non-limiting embodiment, the method may be performed wherein each of the blocks is one of a single level cell, multi-level cell, triple level cell or quad level cell.

While embodiments have been described herein, those skilled in the art, having benefit of this disclosure will appreciate that other embodiments are envisioned that do not depart from the inventive scope of the present application. Accordingly, the scope of the present claims or any subsequent related claims shall not be unduly limited by the description of the embodiments described herein.

What is claimed is:

1. A method for writing data to a NAND flash memory, comprising:
   writing a first set of data to a first memory block;
   writing a second set of data to a second memory block;
   writing a third set of data to a third memory block;
   writing a fourth set of data to a XNOR memory block;
   checking the first memory block, the second memory block and the third memory block with the XNOR memory block;
   correcting at least one of the first memory block, the second memory block and the third memory block when the checking indicates an error in the first memory block, the second memory block and the third memory block;
   writing a fifth set of data to the first memory block;
   writing a sixth set of data to the second memory block;
   writing a seventh set of data to the third memory block; and
   writing a eighth set of data to the XNOR memory block.

2. The method according to claim 1, further comprising:
   checking the first memory block, the second memory block and the third memory block with the XNOR memory block; and
   correcting at least one of the first memory block, the second memory block and the third memory block when the checking indicates an error in the first memory block, the second memory block and the third memory block.

3. The method according to claim 2, further comprising:
   erasing the XNOR memory block after the correcting the at least one of the first memory block, the second memory block and the third memory block when the checking indicates an error in the first memory block, the second memory block and the third memory block.

4. The method according to claim 1, further comprising: compressing the data in the first set of data, the second set of data and the third set of data by an off chip compression method prior to the writing of the data.

5. The method according to claim 2, further comprising: exporting data from the XNOR block to a QLC memory.

6. The method according to claim 5, further comprising: erasing the data in the XNOR block.

7. A device, comprising:
   a NAND flash memory; and
   means for creating a first memory block configured to accept a first set of data for the NAND flash memory;
   means for creating a second memory block configured to accept a second set of data for the NAND flash memory;
   means for creating a third memory block configured to accept a third set of data for the NAND flash memory;
   means for creating a XNOR memory block configured to accept a fourth set of data for the NAND flash memory; and
   means for comparing the fourth set of data to the first set of data, the second set of data and the third set of data.

8. A method for storing data on a flash device, comprising:
   creating at least two blocks of data on the flash drive;
   creating at least one block related to XNOR operations on the flash drive;
   receiving a command for writing at least two sets of data to the at least two blocks of data;
   writing at least a first set of data to at least one created block;
   writing at least a second set of data to a second of the created block;
   writing at least a third set of data to the at least one block for XNOR operations, wherein the third set of data contains the first set of data and the second set of data; and
   checking for errors in writing of the data in the one created block and the second of the created blocks by comparing the data in one block for XNOR operations and the first set of data in the created block and the second set of data in the second created block.

9. The method according to claim 8, further comprising: erasing the at least one block for XNOR operations after the checking for errors.

10. The method according to claim 8, further comprising: copying data from the at least one block for XNOR operations to another memory.

11. The method according to claim 8, wherein the checking for errors is provided by an enhanced post write read operation.

12. The method according to claim 8, further comprising: compressing data with an off chip compression method prior to the writing of data.

13. The method according to claim 8, wherein each block is composed of at least three memory blocks.

14. The method according to claim 8, wherein each of the blocks is one of a single level cell, multi-level cell, triple level cell or quad level cell.

* * * * *